(12) United States Patent
Nurmi (10) Patent No.: US 9,958,997 B2
(45) Date of Patent: May 1, 2018

(54) ADJUSTABLE SHIELD ELECTRODE ARRANGEMENT FOR CAPACITIVE TOUCH SENSOR ARRAY

(71) Applicant: Nokia Technologies Oy, Espoo (FI)

(72) Inventor: Juha Nurmi, Salo (FI)

(73) Assignee: Nokia Technologies Oy, Espoo (FI)

( * ) Notice: Subject to any disclaimer, the term of this patent is extended or adjusted under 35 U.S.C. 154(b) by 0 days. days.

(21) Appl. No.: 15/024,400

(22) PCT Filed: Sep. 18, 2014

(86) PCT No.: PCT/FI2014/050712
§ 371 (c)(1),
(2) Date: Mar. 24, 2016

(87) PCT Pub. No.: WO2015/044517
PCT Pub. Date: Apr. 2, 2015

(65) Prior Publication Data
US 2016/0209962 A1    Jul. 21, 2016

(30) Foreign Application Priority Data
Sep. 25, 2013  (GB) .................. 1317043.6

(51) Int. Cl.
*G06F 3/044*  (2006.01)
*H03K 17/96*  (2006.01)
*G06F 3/041*  (2006.01)

(52) U.S. Cl.
CPC ............ *G06F 3/044* (2013.01); *G06F 3/0416* (2013.01); *H03K 17/9622* (2013.01); *G06F 2203/04101* (2013.01); *G06F 2203/04107* (2013.01); *H03K 2217/960765* (2013.01)

(58) Field of Classification Search
CPC . G06F 2203/04101; G06F 2203/04107; G06F 3/0416; G06F 3/044; H03K 17/9622; H03K 2217/960765
See application file for complete search history.

(56) References Cited

U.S. PATENT DOCUMENTS

| 4,495,485 | A | 1/1985 | Smith ............................ 340/365 |
| 5,457,289 | A | 10/1995 | Huang et al. .................... 178/20 |
| 2007/0269012 | A1* | 11/2007 | Somers ................... A61B 6/102 378/117 |
| 2009/0273570 | A1 | 11/2009 | Degner et al. ................ 345/173 |
| 2010/0110038 | A1* | 5/2010 | Mo .......................... G06F 3/044 345/174 |
| 2010/0201647 | A1 | 8/2010 | Verweg ......................... 345/174 |

(Continued)

FOREIGN PATENT DOCUMENTS

| EP | 2354401 A1 | 8/2011 |
| KR | 20110038846 A | 4/2011 |

*Primary Examiner* — Kenneth Bukowski
(74) *Attorney, Agent, or Firm* — Warrington & Smith (57) ABSTRACT

An apparatus including a plurality of distinct capacitive sensor electrodes distributed over a sensing area; conductive traces connected to respective ones of the plurality of distinct capacitive sensor electrodes; one or more first shield electrode portions, positioned on a first side of the sensing area to overlap, in the sensing area, at least some of the conductive traces, and one or more second shield electrode portions, positioned on the first side of the sensing area to overlap, in the sensing area, at least some of the capacitive sensor electrodes.

19 Claims, 6 Drawing Sheets

(56) References Cited

U.S. PATENT DOCUMENTS

| | | | |
|---|---|---|---|
| 2010/0220071 A1* | 9/2010 | Nishihara | G06F 3/0416 |
| | | | 345/173 |
| 2011/0001549 A1 | 1/2011 | Van Gastel | 327/517 |
| 2011/0018560 A1* | 1/2011 | Kurashima | G06F 3/044 |
| | | | 324/679 |
| 2011/0074733 A1 | 3/2011 | Mäkinen et al. | 345/174 |
| 2011/0090159 A1* | 4/2011 | Kurashima | G06F 3/044 |
| | | | 345/173 |
| 2011/0175671 A1 | 7/2011 | Reynolds | 327/517 |
| 2011/0221700 A1 | 9/2011 | Mo et al. | 345/174 |
| 2012/0074961 A1 | 3/2012 | Herrmann | 324/658 |
| 2012/0235949 A1 | 9/2012 | Ligtenberg | 345/174 |
| 2013/0093696 A1* | 4/2013 | Huang | G06F 3/044 |
| | | | 345/173 |
| 2013/0106774 A1 | 5/2013 | Radivojevic et al. | 345/174 |
| 2013/0162596 A1 | 6/2013 | Kono et al. | 345/174 |
| 2014/0132335 A1* | 5/2014 | Rauhala | G06F 3/044 |
| | | | 327/517 |
| 2014/0185553 A1* | 7/2014 | Suzuki | H04L 1/1858 |
| | | | 370/329 |
| 2014/0218328 A1* | 8/2014 | Haapakoski | G02F 1/13338 |
| | | | 345/174 |
| 2015/0248183 A1* | 9/2015 | Schwartz | G06F 3/044 |
| | | | 345/174 |

* cited by examiner

ADJUSTABLE SHIELD ELECTRODE ARRANGEMENT FOR CAPACITIVE TOUCH SENSOR ARRAY

TECHNOLOGICAL FIELD

Embodiments of the present invention relate to an apparatus. In particular, they relate to an apparatus comprising a plurality of capacitive sensor electrodes distributed over a sensing area.

BACKGROUND

Current touch sensitive displays may use a plurality of capacitive sensor electrodes distributed over a sensing area. The capacitive sensor electrodes sense a proximal grounded object such as a user's finger touching the sensing area.

BRIEF SUMMARY

According to various, but not necessarily all, embodiments of the invention there is provided an apparatus comprising: a plurality of distinct capacitive sensor electrodes distributed over a sensing area; conductive traces connected to respective ones of the plurality of distinct capacitive sensor electrodes; one or more first shield electrode portions, positioned on a first side of the sensing area to overlap, in the sensing area, at least some of the conductive traces, and one or more second shield electrode portions, positioned on the first side of the sensing area to overlap, in the sensing area, at least some of the capacitive sensor electrodes.

According to various, but not necessarily all, embodiments of the invention there is provided a method comprising: at a first time, maintaining one or more first shield electrode portions, positioned on a first side of a sensing arrangement in overlap with conductive traces of the sensing arrangement, and one or more second shield electrode portions, positioned on the first side of the sensing arrangement in overlap with capacitive sensor electrodes of the sensing arrangement, at a common electric potential; and at a second time different time to the first time, maintaining one or more first shield electrode portions, positioned on the first side of the sensing arrangement in overlap with conductive traces of the sensing arrangement, but not one or more second shield electrode portions, positioned on the first side of the sensing arrangement in overlap with capacitive sensor electrodes of the sensing arrangement, at a common electric potential.

According to various, but not necessarily all, embodiments of the invention there is provided an apparatus comprising: at least one processor; and
at least one memory including computer program code the at least one memory and the computer program code configured to, with the at least one processor, cause the apparatus at least to perform: controlling whether one or more first shield electrode portions, positioned on a first side of a sensing arrangement in overlap with conductive traces of the sensing arrangement, and one or more second shield electrode portions, positioned on the first side of the sensing arrangement in overlap with capacitive sensor electrodes of the sensing arrangement, are maintained at a common electric potential or are not maintained at a common electric potential.

According to various, but not necessarily all, embodiments of the invention there is provided computer program, which when loaded into a processor, enables: controlling whether one or more third shield electrode portions, positioned on a second side of the sensing arrangement in overlap with conductive traces of the sensing arrangement, and one or more fourth shield electrode portions, positioned on the second side of the sensing arrangement in overlap with capacitive sensor electrodes of the sensing arrangement, are maintained at a common electric potential or are not maintained at a common electric potential.

BRIEF DESCRIPTION

For a better understanding of various examples of embodiments of the present invention reference will now be made by way of example only to the accompanying drawings in which.

DETAILED DESCRIPTION

The Figures schematically illustrate an apparatus 2 comprising: a plurality of distinct capacitive sensor electrodes 6 distributed over a sensing area 8; conductive traces 10 connected to respective ones of the plurality of distinct capacitive sensor electrodes 6; one or more first shield electrode portions 21, positioned on a first side 35 of the sensing area 8 to overlap, in the sensing area 8, at least some of the conductive traces 10, and one or more second shield electrode portions 22, positioned on the first side 35 of the sensing area 8 to overlap, in the sensing area 8, at least some of the capacitive sensor electrodes 6.

Figure 1:
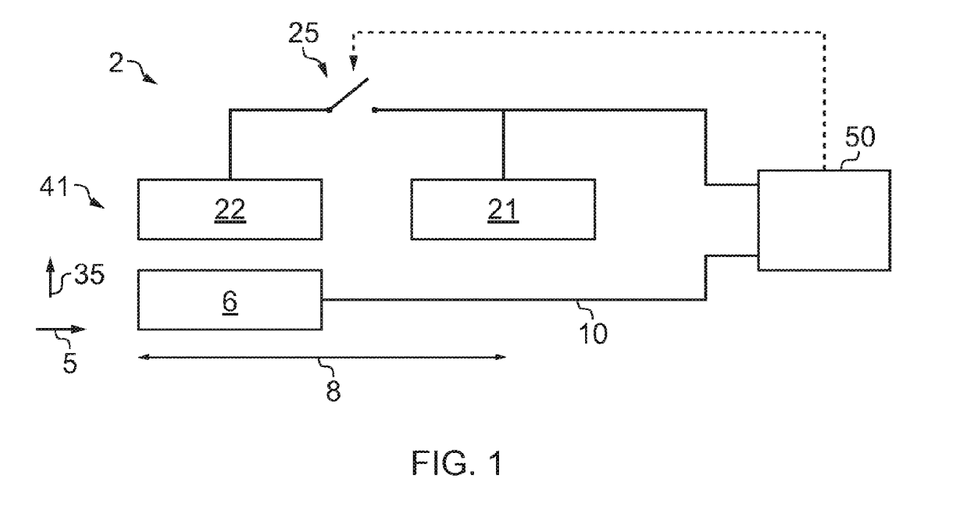
FIG. 1 illustrates an example of an apparatus comprising a configurable shielding arrangement.

FIG. 1 schematically illustrates an example of an apparatus 2 for sensing proximal objects.

The apparatus 2 comprises a capacitive sensing arrangement 5. The capacitive sensing arrangement 5 comprises a plurality of distinct capacitive sensor electrodes 6 distributed over a sensing area 8 and conductive traces 10 connected to respective ones of the plurality of distinct capacitive sensor electrodes 6.

The apparatus 2 additionally comprises a configurable shielding arrangement comprising one or more first shield electrode portions 21 and one or more second shield electrode portions 22.

The one or more first shield electrode portions 21, are positioned on a first side 35 of the sensing area 8 to overlap, in the sensing area 8, at least some of the conductive traces 10.

The one or more second shield electrode portions 22, are positioned on the first side 35 of the sensing area 8 to overlap, in the sensing area 8, at least some of the capacitive sensor electrodes 6.

Circuitry 50 may be configured to apply, when the apparatus 2 is in a first mode (mode A), a first voltage to the one or more first shield electrode portions 21 but not to the one or more second shield electrode portions 22. The first voltage may be a time varying voltage such as an alternating voltage.

In the first mode, the one or more first shield electrode portions 21 may be operated as a single electrode independently of the one or more second shield electrode portions 22, which the circuitry 50 has electrically isolated so that they are 'floating'. This is equivalent to switch 25 being open in FIG. 1.

Circuitry 50 may be configured to apply, when the apparatus 2 is in a second mode (mode B), a second voltage to the one or more first shield electrode portions 21 and the one or more second shield electrode portions 22. The second voltage may be a time varying voltage such as an alternating voltage. The second voltage may be the same or different to the first voltage.

In the second mode, the one or more first shield electrode portions 21 and the one or more second shield electrode portions 22 may be operated as a single electrode. This is equivalent to switch 25 being closed in FIG. 1.

The circuitry 50 may configured to switch the apparatus 2 between the first mode and the second mode.

In some embodiments the circuitry 50 may be part of the apparatus 2. In other embodiments the circuitry 50 may be wholly or partially separate to the apparatus 2.

Table 1 summarizes the operation of the apparatus 2 according to FIG. 1.

TABLE 1

| Mode | Switch 25 | | Function |
|---|---|---|---|
| A | Open | $V_{22}$ floating | Sensing |
| B | Closed | $V_{21}$, $V_{22}$ common | Shielding |

In mode A, the switch 25 is open, electrically isolating the one or more second shield electrode portions 22. The potential of the one or more second shield electrode portions 22 float and they provide windows to the capacitive sensor electrodes 6. The first side 35 of the apparatus 2 therefore operates as a proximity sensor.

It is desirable to keep the electrical resistance of the conductive traces 10 small to reduce resistance-capacitance (RC) delays and improve measurement speed. This may be achieved by using material that has a higher conductivity and/or by making the conductive traces 10 wider. However, widening the conductive traces 10 increases the area occupied by the conductive traces 10 and may create undesirable stray capacitance effects. However this effect is reduced or eliminated by the overlying one or more first shield electrode portions 21.

In mode B, the switch 25 is closed, electrically connecting the one or more second shield electrode portions 22 to the one or more first shield electrode portions 21. A common potential is applied to both the one or more first shield electrode portions 21 and the one or more second shield electrode portions 22. The first side 35 of the apparatus 2 therefore operates as a shield.

Figure 2:
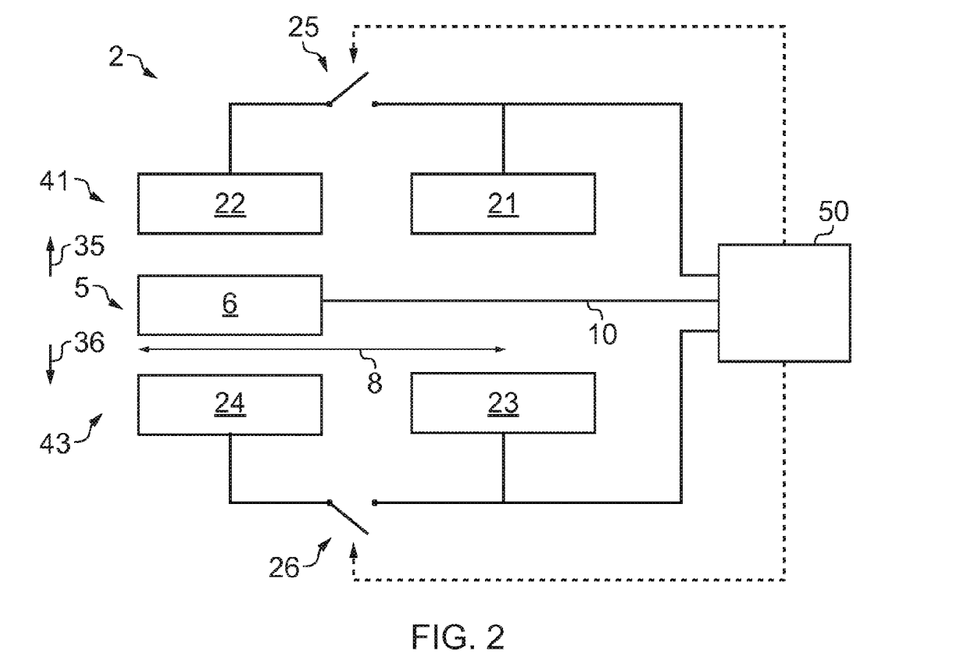
FIG. 2 illustrates an example of an apparatus comprising two configurable shielding arrangements.

FIG. 2 schematically illustrates an example of an apparatus 2 for sensing proximal objects.

This apparatus 2 is similar to the apparatus 2 illustrated in FIG. 1 and similar features are designated using similar reference numbers.

The apparatus 2 comprises a capacitive sensing arrangement 5. The capacitive sensing arrangement 5 comprises a plurality of distinct capacitive sensor electrodes 6 distributed over a sensing area 8 and conductive traces 10 connected to respective ones of the plurality of distinct capacitive sensor electrodes 6.

The apparatus 2 additionally comprises a configurable first shielding arrangement 41 associated with a first side 35 and a configurable second shielding arrangement 43 associated with a second side 36.

The first shielding arrangement 41 comprises one or more first shield electrode portions 21, positioned on a first side 35 of the sensing area 8 to overlap, in the sensing area 8, at least some of the conductive traces 10.

The first shielding arrangement 41 additionally comprises one or more second shield electrode portions 22, positioned on the first side 35 of the sensing area 8 to overlap, in the sensing area 8, at least some of the capacitive sensor electrodes 6.

The second shielding arrangement 43 comprises one or more third shield electrode portions 23, positioned on a second side 36 of the sensing area 8 to overlap, in the sensing area 8, at least some of the conductive traces 10.

The second shielding arrangement 43 additionally comprises one or more fourth shield electrode portions 24, positioned on the second side 36 of the sensing area 8 to overlap, in the sensing area 8, at least some of the capacitive sensor electrodes 6.

Figure 3:
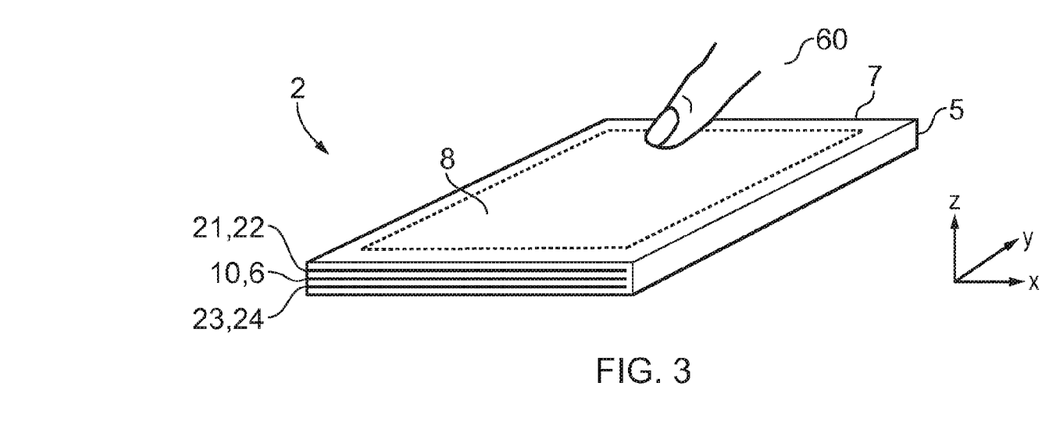
FIG. 3 illustrates a perspective view of an example of an apparatus comprising one or two configurable shielding arrangements.

As illustrated in FIG. 3, the apparatus 2 comprises a capacitive sensing arrangement 5 that is configured to sense a variation in capacitance arising from proximity of an object 60 such as a user input device at or over the sensing area 8 of a touch surface 7. In this example the user input device 60 is a user's finger.

The apparatus 2 is configured to enabling sensing of not only the (x, y) position of the user's finger within the sensing area 8 when it touches the sensing area 8 of the touch surface 7 but may also, in this example, additionally sense a (z) position of the user's finger when it is close to but not touching the sensing area 8 of the touch surface 7 and/or sense an (x, y) position of the user's finger when it is close to but not yet touching the sensing area of the touch surface 7. The apparatus 2 therefore enables not only two-dimensional sensing but also three-dimensional sensing.

Figure 4:
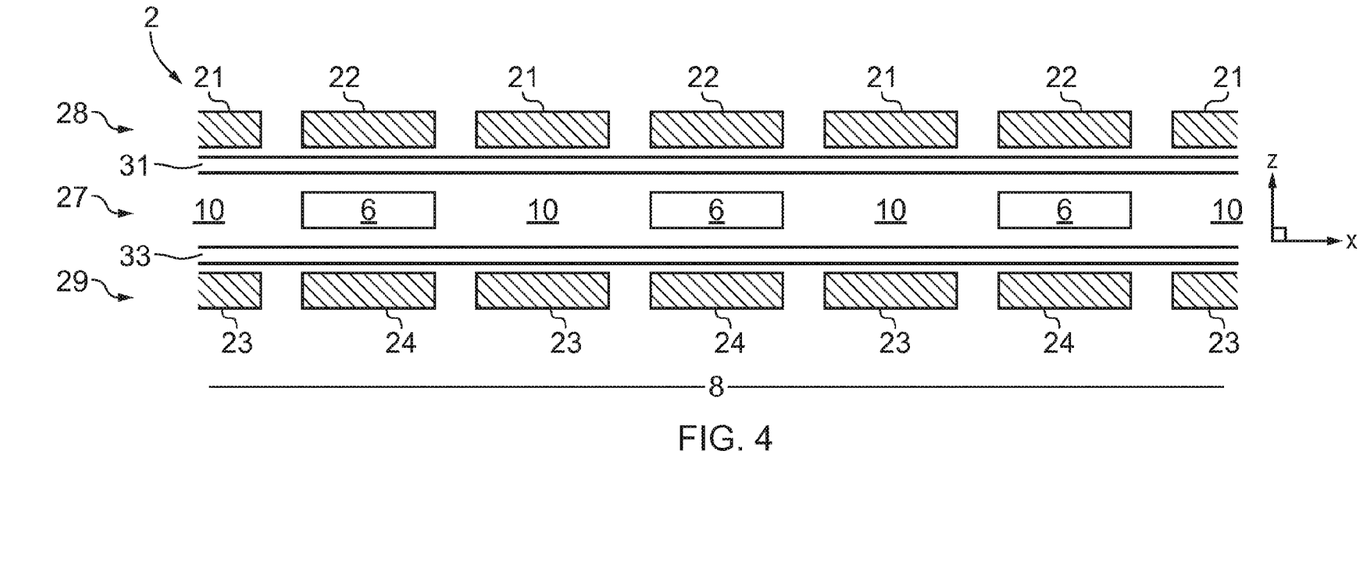
FIG. 4 illustrates a cross-sectional view of an example of an apparatus comprising two configurable shielding arrangements.

FIG. 4 is an example of a cross-section through an example of an apparatus 2.

The one or more second shield electrode portions 22 overlap, in the sensing area 8, the capacitive sensor electrodes 6 but not the conductive traces 10. An insulating layer 31 separates the second shield electrode portions 22 and the capacitive sensor electrodes 6.

The one or more first shield electrode portions 21 overlap, in the sensing area 8, the conductive traces 10. The insulating layer 31 separates the first shield electrode portions 21 and the conductive traces 10.

The one or more fourth shield electrode portions 24 overlap, in the sensing area 8, the capacitive sensor electrodes 6 but not the conductive traces 10. An insulating layer 33 separates the fourth shield electrode portions 24 and the capacitive sensor electrodes 6.

The one or more third shield electrode portions 23 overlap, in the sensing area 8, the conductive traces 10. The insulating layer 33 separates the third shield electrode portions 23 and the conductive traces 10.

In this example, but not necessarily all examples the capacitive sensor electrodes 6 and the conductive traces 10 occupy a first common planar layer 27, the one or more first shield electrode portions 21 and the one or more second shield electrode portions 22 share a sensing common layer 28 and the one or more third shield electrode portions 23 and the one or more fourth shield electrode portions 24 share a second common layer 29.

Circuitry 50 may be configured to operate the configurable first shielding arrangement 41 in a mode A or a mode B, as previously described with reference to FIG. 1.

In mode A, the circuitry 50 provides a first voltage to the one or more first shield electrode portions 21 but not to the one or more second shield electrode portions 22. The first voltage may be a time varying voltage such as an alternating voltage.

In mode A, the one or more first shield electrode portions 21 may be operated as a single electrode independently of the one or more second shield electrode portions 22, which the circuitry 50 has electrically isolated so that they are 'floating'. This is equivalent to switch 25 being open in FIG. 1 or FIG. 2.

The potential of the one or more second shield electrode portions 22 float and they provide windows to the capacitive sensor electrodes 6. The first side 35 of the apparatus 2 therefore operates as a proximity sensor.

In mode B, the circuitry 50 provides a second voltage to the one or more first shield electrode portions 21 and the one or more second shield electrode portions 22. The second voltage may be a time varying voltage such as an alternating voltage. The second voltage may be the same or different to the first voltage.

In mode B, the one or more first shield electrode portions 21 and the one or more second shield electrode portions 22 may be operated as a single electrode. This is equivalent to switch 25 being closed in FIG. 1 or 2.

A common potential is applied to both the one or more first shield electrode portions 21 and the one or more second shield electrode portions 22. The first side 35 of the apparatus 2 therefore operates as a shield.

Circuitry 50 may be configured to operate the configurable second shielding arrangement 43 in a mode A or a mode B, similar to that previously described with reference to FIG. 1.

In mode A, the circuitry 50 provides a third voltage to the one or more third shield electrode portions 23 but not to the one or more fourth shield electrode portions 24. The third voltage may be a time varying voltage such as an alternating voltage.

In mode A, the one or more third shield electrode portions 23 may be operated as a single electrode independently of the one or more fourth shield electrode portions 24, which the circuitry 50 has electrically isolated so that they are 'floating'. This is equivalent to switch 26 being open in FIG. 2.

The potential of the one or more fourth shield electrode portions 24 float and they provide windows to the capacitive sensor electrodes 6. The second side 36 of the apparatus 2 therefore operates as a proximity sensor.

In mode B, the circuitry 50 provides a fourth voltage to the one or more third shield electrode portions 23 and the one or more fourth shield electrode portions 24. The fourth voltage may be a time varying voltage such as an alternating voltage. The fourth voltage may be the same or different to the third voltage.

In mode B, the one or more third shield electrode portions 23 and the one or more fourth shield electrode portions 24 may be operated as a single electrode. This is equivalent to switch 26 being closed in FIG. 2.

A common potential is applied to both the one or more third shield electrode portions 23 and the one or more fourth shield electrode portions 24. The second side 36 of the apparatus 2 therefore operates as a shield.

The circuitry 50 may configured to switch the first shielding arrangement 41 between mode A and Mode B and switch the second shielding arrangement 43 between mode A and mode B.

In some embodiment the circuitry 50 may be part of the apparatus 2. In other embodiments the circuitry 50 may be wholly or partially separate to the apparatus 2.

AB Mode

When the first shielding arrangement 41 is in mode A and the second shielding arrangement 43 is in mode B, the apparatus 2 is in a first mode AB.

In this first mode, the circuitry 50 applies a common voltage to the one or more third shield electrode portions 23, to the one or more fourth shield electrode portions 24 and to the one or more first shield electrode portions 21 but not to the one or more second shield electrode portions 22. The common voltage may be a time varying voltage such as an alternating voltage.

The one or more third shield electrode portions 23, the one or more fourth shield electrode portions 24 and the one or more first shield electrode portions 21 may be operated as a common electrode independent from the one or more second shield electrode portions 22, which the circuitry 50 has electrically isolated so that they are 'floating'.

This is equivalent to switch 25 being open and switch 26 being closed in FIG. 2.

Figure 5A:
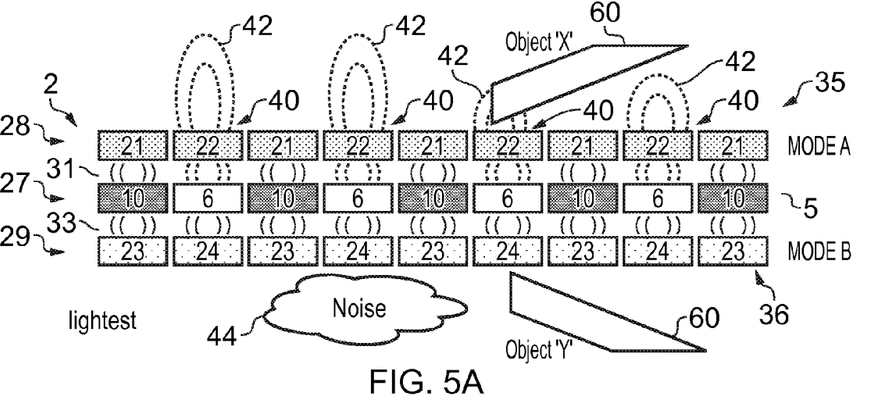
FIGS. 5A, 5B and 5C illustrate a cross-sectional view of an example of an apparatus, comprising two configurable shielding arrangements, in different modes.

FIG. 5A illustrates a cross-sectional view of an apparatus 2 when it is in a first mode AB.

The one or more second shield electrode portions 22 float and provide windows 40, on the first side 35 of the apparatus 2, to the capacitive sensor electrodes 6, through which the capacitive sensor electrodes 6 project their electric field 42 to the first side 35 for sensing. A conductive object 60 (Object X) proximal to a window 40 will disrupt the electric field 42 projected from that window 40. This change in electric field can be detected by circuitry 50. The first side 35 of the apparatus 2 therefore operates as a proximity sensor.

A common potential is applied to the one or more first shield electrode portions 21, the one or more third shield electrode portions 23 and the one or more fourth shield electrode portions 24. The second side 36 of the apparatus 2 therefore operates as a shield for the whole sensing arrangement 5. The capacitive sensor electrodes 6 do not project their electric field 42 to the second side 36. A conductive object 60 (Object Y) or other noise 44 proximal to the second side 36 of the apparatus 2 will not disrupt the electric field 42 associated with a capacitive sensor electrode 6.

BA Mode

When the first shielding arrangement 41 is in mode B and the second shielding arrangement 43 is in mode A, the apparatus 2 is in a second mode BA.

In this second mode, the circuitry 50 applies a common voltage to the one or more first shield electrode portions 21, to the one or more second shield electrode portions 22 and to the one or more third shield electrode portions 23 but not to the one or more fourth shield electrode portions 24. The common voltage may be a time varying voltage such as an alternating voltage.

The one or more first shield electrode portions 21, the one or more second shield electrode portions 22 and the one or more third shield electrode portions 23 may be operated as a common electrode independent from the one or more fourth shield electrode portions 24, which the circuitry 50 has electrically isolated so that they are 'floating'.

This is equivalent to switch 25 being closed and switch 26 being open in FIG. 2.

Figure 5B:
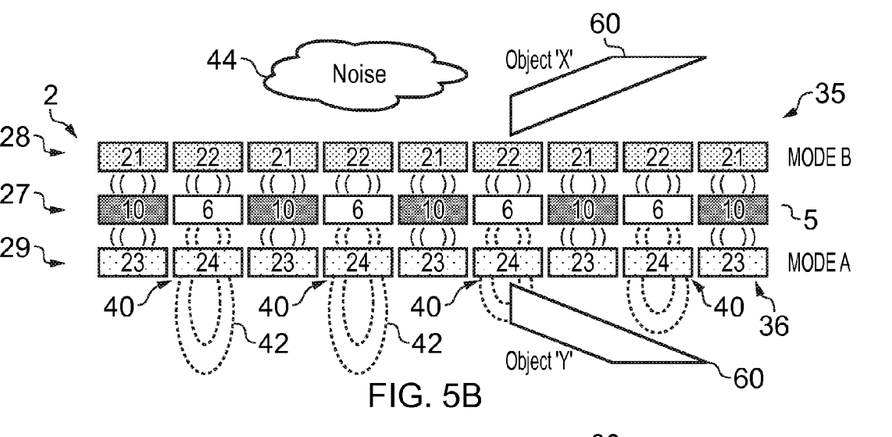

FIG. 5B illustrates a cross-sectional view of an apparatus when it is in a second mode BA.

The one or more fourth shield electrode portions 24 float and provide windows 40, on the second side 36 of the apparatus 2, to the capacitive sensor electrodes 6, through which the capacitive sensor electrodes 6 project their electric field 42 to the second side 36. A conductive object 60 (Object Y) proximal to a window 40 will disrupt the electric field 42 projected from that window 40. This change in electric field can be detected by circuitry 50. The second side 36 of the apparatus 2 therefore operates as a proximity sensor.

A common potential is applied to the one or more first shield electrode portions 21, the one or more second shield electrode portions 22 and the one or more third shield electrode portions 23. The first side 35 of the apparatus 2 therefore operates as a shield for the whole sensing arrangement 5. The capacitive sensor electrodes 6 do not project their electric field 42 to the first side 35. A conductive object 60 (Object X) or other noise 44 proximal to the first side 35 of the apparatus 2 will not disrupt the electric field 42 associated with a capacitive sensor electrode 6.

AA Mode

When the first shielding arrangement 41 is in mode A and the second shielding arrangement 43 is in mode A, the apparatus 2 is in a third mode AA.

In this third mode, the circuitry 50 applies a common voltage to the one or more first shield electrode portions 21, and to the one or more third shield electrode portions 23 but not to the one or more fourth shield electrode portions 24 nor to the to the one or more second shield electrode portions 22. The common voltage may be a time varying voltage such as an alternating voltage.

The one or more first shield electrode portions 21 and the one or more third shield electrode portions 23 may be operated as a common electrode independent from the one or more fourth shield electrode portions 24 and the one or more second shield electrode portions 22. The circuitry 50 has electrically isolated the one or more second shield electrode portions 22 and, the one or more fourth shield electrode portions 24 so that they are 'floating'.

This is equivalent to switch 25 being open and switch 26 being open in FIG. 2.

Figure 5C:
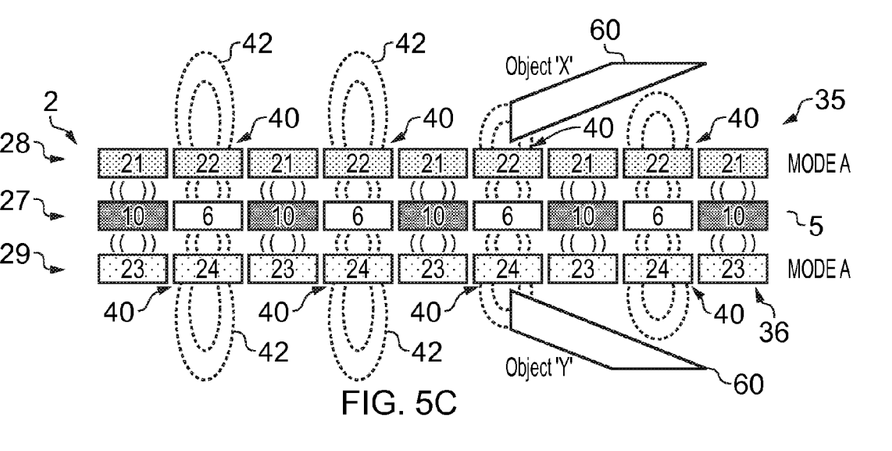

FIG. 5C illustrates a cross-sectional view of an apparatus when it is in a third mode AA.

The one or more second shield electrode portions 22 float and provide windows 40, on the first side 35 of the apparatus 2, to the capacitive sensor electrodes 6, through which the capacitive sensor electrodes 6 project their electric field 42 to the first side 35. A conductive object 60 (Object X) proximal to a window 40 will disrupt the electric field 42 projected from that window 40. This change in electric field can be detected by circuitry 50. The first side 35 of the apparatus 2 therefore operates as a proximity sensor.

The one or more fourth shield electrode portions 24 float and provide windows 40, on the second side 36 of the apparatus 2, to the capacitive sensor electrodes 6, through which the capacitive sensor electrodes 6 project their electric field 42 to the second side 36. A conductive object 60 (Object Y) proximal to a window 40 will disrupt the electric field 42 projected from that window 40. This change in electric field can be detected by circuitry 50. The second side 36 of the apparatus 2 therefore operates as a proximity sensor. There is no shield for the whole sensing arrangement 5.

Table 2 below, for each of the first, second and third modes of the apparatus 2, identifies whether the switches 25, 26 are open or closed, identifies which of the shield electrode portions have floating voltages and which have common voltages, and identifies whether the first side and the second side operate as shield or sensor. The voltage at shield electrode portions nm is indicated using $V_{nm}$.

TABLE 2

| Mode | Switch 25 | Switch 26 | Floating | Common | First side | Second side |
|---|---|---|---|---|---|---|
| AB | Open | Closed | $V_{22}$ | $V_{21}, V_{23}, V_{24}$ | Sensing | Shielding |
| BA | Closed | Open | $V_{24}$ | $V_{21}, V_{22}, V_{23}$ | Shielding | Sensing |
| AA | Open | Open | $V_{22}, V_{24}$ | $V_{21}, V_{23}$ | Sensing | Sensing |

In some but not necessarily all embodiment, the circuitry 50 may be configured to use the third mode AA initially to make a coarse detection of a proximal object.

The circuitry 50 may be configured to use the first mode AB and/or the second mode BA subsequently to make a more accurate detection of a proximal object.

The first mode AB and the second mode BA may be more accurate because they provide a shield for the whole sensing arrangement 5.

Figure 6A:
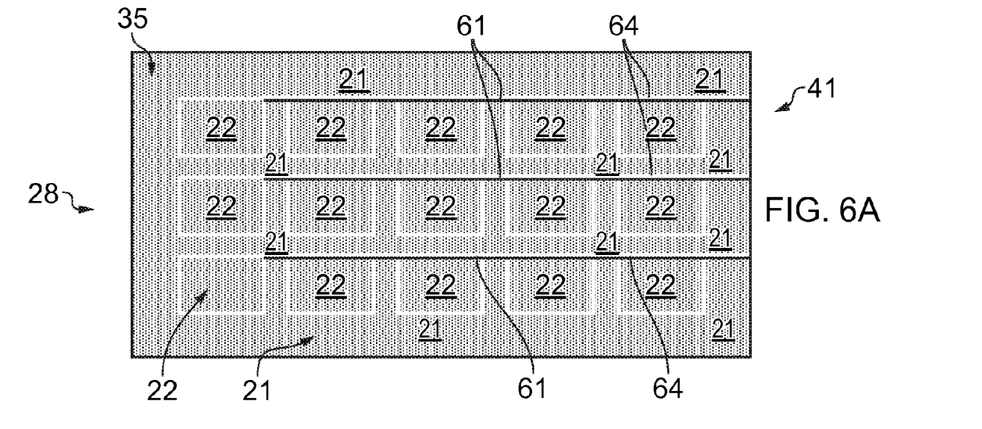
FIGS. 6A, 6B and 6C illustrate in plan view components of an apparatus, comprising two configurable shielding arrangements.
Figure 6B:
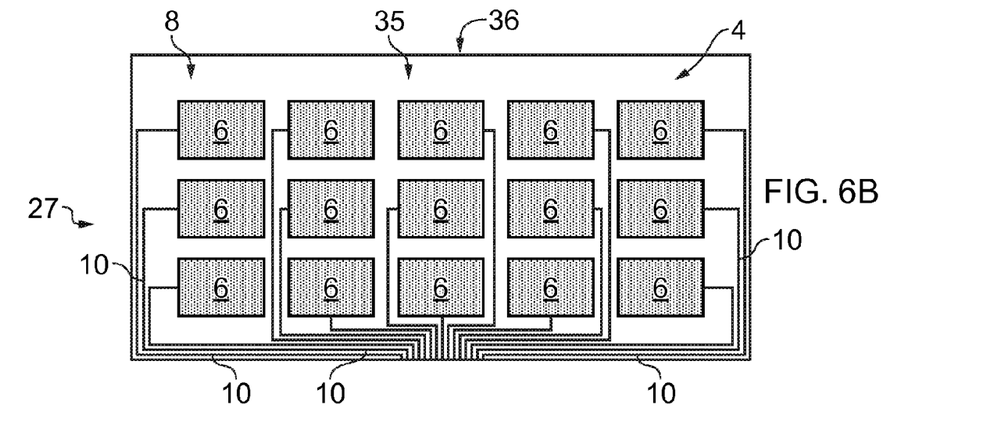

FIG. 6B illustrates an example of a sensing arrangement 5 that occupies a first common planar 27 of the apparatus 2.

The sensing arrangement 5 comprises a plurality of capacitive sensor electrodes 6 distributed over a sensing area 8 and conductive traces 10 partially distributed over the sensing area 8.

The plurality of capacitive sensor electrodes 6 are arranged as an array 4 in this example, the array 4 is in this example a regular array. The capacitive sensor electrodes are arranged as an N row by M column regular array 4, with common fixed spacing between columns and common fixed spacing between rows.

Each capacitive sensor electrode 6 has an associated conductive trace 10 for conveying a signal generated by that sensor electrode 6 away from the sensor area 8. In the illustrated example, each sensor electrode 6 and its associated conductive trace 10 is physically connected.

The sensor electrodes 6 and the conductive traces 10 are, in this example, arranged within the first common planar layer 27. They may, for example, be formed by patterning a planar layer of transparent conductive material.

In this example but not necessarily all examples, the sensor electrodes 6 have sizes less than 0.5 cm². They may for example have dimensions of less than 6 mm by 6 mm.

FIG. 6A illustrates an example of a first shielding arrangement 41, comprising the one or more first shield electrode portions 21 and the one or more second shield electrode portions 22. In this example, the one or more first shield electrode portions 21 and one or more second shield electrode portions 22 occupy a first common planar layer 28 of the apparatus 2.

In the apparatus 2, the one or more first shield electrode portions 21, are positioned on a first side 35 of the sensing area 8 to overlap, in the sensing area 8, at least some of the conductive traces 10, and the one or more second shield electrode portions 22, are positioned on the first side 35 of the sensing area 8 to overlap, in the sensing area 8, at least some of the capacitive sensor electrodes 6.

In this example but not necessarily all examples, the one or more first shield electrode portions 21 and the one or more second shield electrode portions 22 are formed from the same patterned conductive and transparent material.

In this example but not necessarily all examples, the one or more second shield electrode portions 22 are configured to substantially align with the capacitive sensor electrodes 6.

In this example but not necessarily all examples, the one or more first shield electrode portions 21 and the one or more second shield electrode portions 22 are configured to overlap substantially all of the sensing area 8 with only small gaps separating first shield electrode portions 21 and second shield electrode portions 22.

Figure 6C:
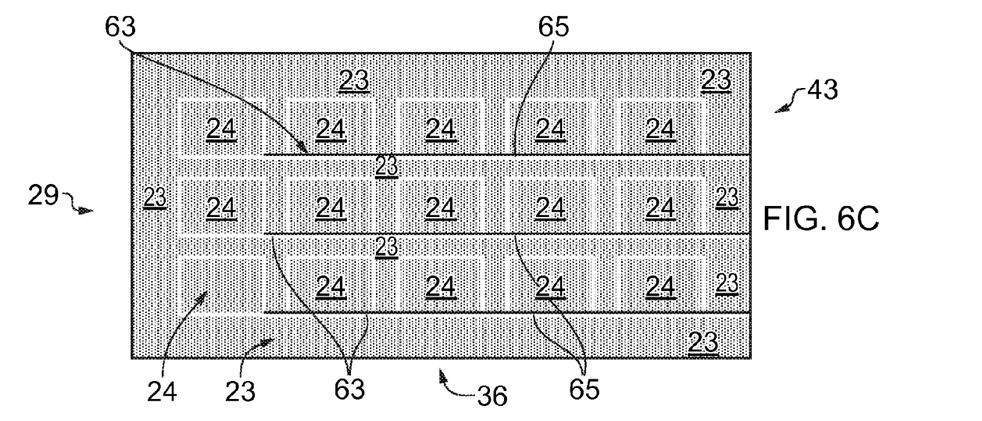

FIG. 6C illustrates an example of a second shielding arrangement 43, comprising the one or more third shield electrode portions 23 and the one or more fourth shield electrode portions 24. In this example, the one or more third shield electrode portions 23 and the one or more fourth shield electrode portions 24 occupy a second common planar layer 29 of the apparatus 2.

In the apparatus 2, the one or more third shield electrode portions 23, are positioned on a second side 36 of the sensing area 8 to overlap, in the sensing area 8, at least some of the conductive traces 10, and the one or more fourth shield electrode portions 24, are positioned on the second side 36 of the sensing area 8 to overlap, in the sensing area 8, at least some of the capacitive sensor electrodes 6.

In this example but not necessarily all examples, the one or more third shield electrode portions 23 and the one or more fourth shield electrode portions 24 are formed from the same patterned conductive and transparent material.

In this example but not necessarily all examples, the one or more fourth shield electrode portions 24 are configured to substantially align with the capacitive sensor electrodes 6.

In this example but not necessarily all examples, the one or more third shield electrode portions 23 and the one or more fourth shield electrode portions 24 are configured to overlap substantially all of the sensing area 8 with only small gaps separating third shield electrode portions 23 and fourth shield electrode portions 24.

The one or more first/third shield electrode portions 21/23 may, in some examples but not necessarily all examples, overlap at least portions of at least some of the sensor electrodes 6. The portions of the sensor electrodes 6 that are not overlapped define operational sensor electrodes 6 of equal operational size, in this example. As the sensor electrodes 6 are of similar construction they have the same capacitance per unit area. Therefore the operational sensor electrodes 6 of equal operational size have equal capacitance.

The one or more first/third shield electrode portions 21/23 may, in some examples but not necessarily all examples, overlap all of the conductive traces 10. In other examples, more than 80% of the area occupied by the conductive traces 10 is overlapped.

As illustrated in FIGS. 6A and 6B, the one or more first/third shield electrode portions 21/23 may cover the whole of the sensing area 8 except at through openings to the underlying capacitive sensor electrodes 6 that are occupied by the one or more second/fourth shield electrode portions 22/24. The openings are of equal size. The openings can be of any shape (for example, rectangle (as shown in the attached drawing), round, star etc.).

The conductive traces 10, the capacitive sensor electrodes 6 and the one or more shield electrode portions 21, 22, 23, 24 may be formed from conductive and transparent material. They may be formed from the same or similar material or mixtures of material. Examples of suitable conductive and transparent materials include, for example, Indium-Tin-Oxide (ITO), metal mesh, silver nanowires and carbon nanotube composite.

The one or more second shield electrode portions 22 are arranged in rows and columns corresponding to the regular array 4 of the capacitive sensor electrodes 6. The one or more second shield electrode portions 22 in each row are interconnected by interconnects 61. Each interconnect 61 runs through a gap 64 in the one or more first shield electrode portions 21.

The one or more fourth shield electrode portions 24 are arranged in rows and columns corresponding to the regular array 4 of the capacitive sensor electrodes 6. The one or more fourth shield electrode portions 24 in each row are interconnected by interconnects 63. Each interconnect 63 runs through a gap 65 in the one or more third shield electrode portions 23.

In the apparatus 2, the interconnects 61 between the second shield electrode portions 22 and the interconnects 63 between the fourth shield electrode portions 24 do not overlap.

In FIG. 6A the one or more first shield electrode portions 21 are configured to form a pattern that comprises an opening for each of the one or more second shield electrode portions 22. The one or more first shield electrode portions 21 are configured to substantially surround each of the one or more second shield electrode portions 22. Narrow channels extend through the first shield electrode portions 21 parallel to the rows for gaps 64 for interconnects 61.

In FIG. 6C the one or more third shield electrode portions 23 are configured to form a pattern that comprises an opening for each of the one or more fourth shield electrode portions 24. The one or more third shield electrode portions 23 are configured to substantially surround each of the one or more fourth shield electrode portions 24. Narrow channels extend through the third shield electrode portions 23 parallel to the rows form gaps 65 for interconnects 63.

Whereas the openings in the one or more first shield electrode portions 21 for the one or more second shield electrode portions 22 are substantially aligned with and overlap the openings in the one or more third shield electrode portions 23 for the one or more fourth shield electrode portions 24, the gaps 64 and gaps 65 do not overlap.

Figure 7:
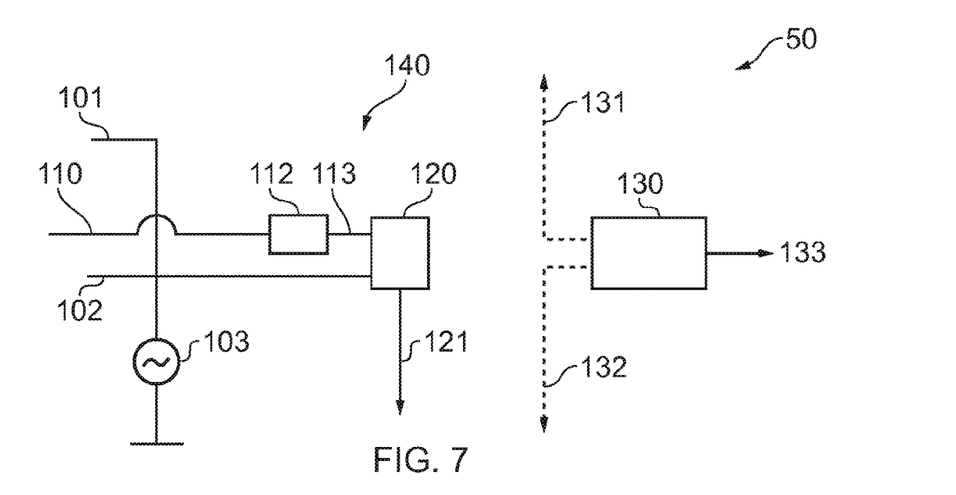
FIG. 7 illustrates an example of control circuitry for use with an apparatus, comprising two configurable shielding arrangements.

In some but not necessarily all example, the circuitry 50 may be implemented as illustrated in the example of FIG. 7.

The circuitry 50 comprises detection control circuitry 140 for enabling shielding and detecting proximity of an object.

The detection control circuitry 140 is configured to provide a common voltage V to the first shielding arrangement 41 via signal 101 and the second shielding arrangement 43 via signal 102. The provided voltage V may be a fixed voltage or a time-varying voltage. One of many examples of a time varying voltage is an alternating sinusoidal voltage.

The detection control circuitry 140 is configured to receive input signals 110 from the capacitive sensor electrodes 6 and detect an electric field change at each of the capacitive sensor electrodes 6. It produces an output signal 121.

Mode control circuitry 130 is configured to produce a first mode control signal 131 that controls whether the first shielding arrangement 41, comprising the one or more first shield electrode portions 21 and the one or more second shield electrode portions 22, is operating in mode A (the first shield electrode portions 21 are connected to the common voltage V but the second shield electrode portions 22 are not) or mode B (the first shield electrode portions 21 and the second shield electrode portions 22 are connected to the common voltage V).

The mode control circuitry 130 is configured to produce a second mode control signal 132 that controls whether the second shielding arrangement 43, comprising the one or more third shield electrode portions 23 and the one or more fourth shield electrode portions 24, is operating in mode A (the third shield electrode portions 23 are connected to the common voltage V but the fourth shield electrode portions 24 are not) or mode B (the third shield electrode portions 23 and the fourth shield electrode portions 24 are connected to the common voltage V).

The mode control circuitry 130 is configured to produce a mode output signal 133 that is indicative of the current mode of the first shielding arrangement 41 and second shielding arrangement 43.

In the illustrated example of FIG. 7, the detection control circuitry 140 comprises a voltage source 103; a multiplexer 112; and detection circuitry 120.

The voltage source 103 is configured to provide its output as a first output voltage signal 101 for the first shielding arrangement 41, as a second output voltage signal 102 for the second shielding arrangement 43 and as a reference input to the detection circuitry 120.

In this example, the voltage source 103 comprises drive circuitry configured to provide a time-varying voltage. The time-varying voltage may be, for example, an alternating sinusoidal voltage. The voltage source 103 is thus configured to provide a time varying electric field at each of the capacitive sensor electrodes 6.

The drive voltage and the drive frequency typically range from 1 V to 10 V and from 10 to 200 kHz, respectively.

The multiplexer 112 is configured to receive input signals 110 from the capacitive sensor electrodes 6 and produce a multiplexed signal 113, which is provided as an input signal 113 to the detection circuitry 120. The multiplexer 112 is configured to isolate, for detection, each of the plurality of capacitive sensor electrodes 6 of the array 4.

The detection circuitry 120 is configured to receive the multiplexed signal 113 and the output from the voltage source 103 and produce an output detection signal 121.

The detection circuitry 120 is configured to detect a variation in electric field arising from proximity of an object 60 such as a user input device to one or more of the plurality of capacitive sensor electrodes 6. The detection circuitry 120 may comprise a low-impedance charge amplifier.

When the user's hand, or some other grounded object 60, is brought to the vicinity of the sensing area 8 of the apparatus 2, a capacitive current flows through the detection circuitry 120 to one or more capacitive sensing electrodes 6.

The charge amplifier in the detection circuitry 120 registers a charge displacement due to the current. The output of the charge amplifier may be rectified, for example synchronously rectified, and integrated, after which it is passed to an analog-to-digital converter and then provided as digital output 121 for processing in the digital domain.

Due to reasons of cost and size, a single charge amplifier and a single analog-to-digital converter may be used in the detection circuitry 120 for multiple capacitive sensing electrodes 6 and a multiplexer 112 may be used to isolate for sensing each capacitive sensing electrode 6 separately.

Figure 8:
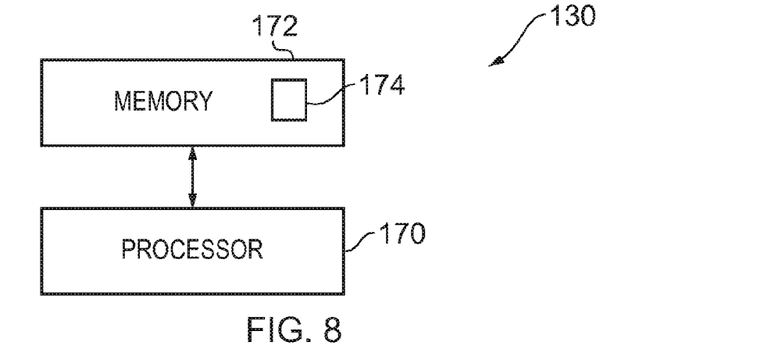
FIG. 8 illustrates an example of mode control circuitry.

In some examples but not necessarily all examples, the mode control circuitry 130 may be implemented using a programmable processor 170 as illustrated in FIG. 8.

The processor 170 is configured to read from and write to a memory 172. The processor 170 may also comprise an output interface via which data and/or commands are output by the processor 170 and an input interface via which data and/or commands are input to the processor 170.

The memory 172 stores a computer program 174 comprising computer program instructions (computer program code 174) that controls the operation of the apparatus 2 when loaded into the processor 170. The processor 170 by reading the memory 172 is able to load and execute the computer program 174.

FIG. 8 therefore illustrates an example of mode control circuitry 130 comprising: at least one processor 170; and at least one memory 172 including computer program code 174 the at least one memory 172 and the computer program code 174 configured to, with the at least one processor 170, cause the model control circuitry 130 at least to perform: controlling whether one or more first shield electrode portions 21, positioned on a first side 35 of a sensing arrangement 5 in overlap with conductive traces 10 of the sensing arrangement 5, and one or more second shield electrode portions 22, positioned on the first side 35 of the sensing arrangement 5 in overlap with capacitive sensor electrodes 6 of the sensing arrangement 5, are maintained at a common electric potential or are not maintained at a common electric potential; and
controlling whether one or more third shield electrode portions 23, positioned on a second side 36 of the sensing arrangement 5 in overlap with conductive traces 10 of the sensing arrangement 5, and one or more fourth shield electrode portions 24, positioned on the second side 36 of the sensing arrangement 5 in overlap with capacitive sensor electrodes 6 of the sensing arrangement 5, are maintained at the common electric potential or are not maintained at the common electric potential.

The computer program 174 may arrive at the mode control circuitry 130 via any suitable delivery mechanism. The delivery mechanism may be, for example, a non-transitory computer-readable storage medium, a computer program product, a memory device, a record medium such as a compact disc read-only memory (CD-ROM) or digital versatile disc (DVD), an article of manufacture that tangibly embodies the computer program 174. The delivery mechanism may be a signal configured to reliably transfer the computer program 174.

Although the memory 172 is illustrated as a single component it may be implemented as one or more separate components some or all of which may be integrated/removable and/or may provide permanent/semi-permanent/dynamic/cached storage.

Although the processor 170 is illustrated as a single component it may be implemented as one or more separate components some or all of which may be integrated/removable.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

Figure 9A:
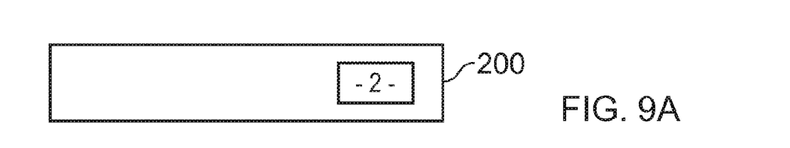
FIG. 9A illustrates a touch panel module.

FIG. 9A illustrates a touch panel module 200 that comprises the apparatus 2. The touch panel module 200 may be used in combination with a display to form a touch screen display.

Figure 9B:
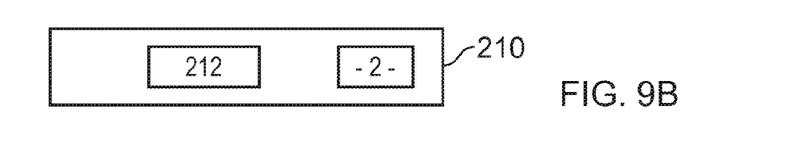
FIG. 9B illustrates a touch sensitive display module.

FIG. 9B illustrates a touch sensitive display module 210 that comprises the apparatus 2 and a display 212.

In this example, the apparatus 2 overlaps the display 212 and operates as a capacitive touch panel for the display 212. The display 212 and the apparatus 2 in combination form a touch sensitive display module 210 configured to detect a variation in capacitance arising from proximity of a user input device or other conductive object to one or more of the plurality of capacitive sensor electrodes 6.

The sensing area 8 overlaps the display area of the display. As the apparatus 2 overlaps the display 212 it is preferably transparent. Therefore the shielding electrode portions 21-24, the capacitive sensor electrodes 6 and the conductive traces 10 are preferably transparent.

Figure 9C:
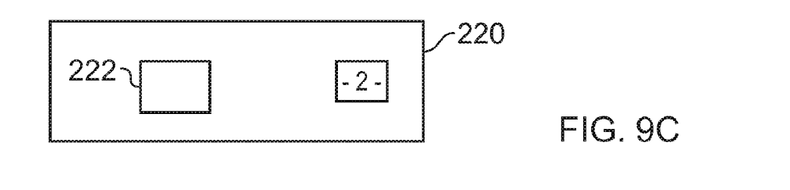
FIG. 9C illustrates an electronic device.

FIG. 9C illustrates an electronic device 220 that comprises at least the apparatus 2. It may, for example, additionally comprise a processor 222 that processes the outputs 121, 133 of the circuitry 50.

Figure 10A:
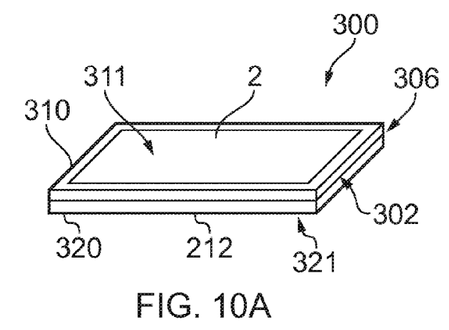
FIGS. 10A and 10B illustrate a configurable electronic apparatus.
Figure 10B:
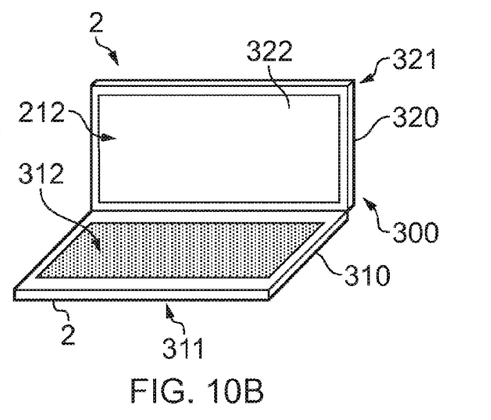

FIGS. 10A and 10B illustrate a configurable electronic apparatus 300. In this example the configurable apparatus 300 comprises a detection part 310 that comprises the apparatus 2 and a display part 320 that comprises a display 212.

The electronic apparatus 300 comprises a hinge 306 that enables relative rotation of the detection part 310 that comprises the apparatus 2 and the display part 320.

The configurable electronic apparatus 300 has a first configuration illustrated in FIG. 10A. The apparatus 2 operates as a touch panel that overlays the display 212. The first side 311 of the detection part 310 is used for detection. The first side 311 of the detection part 310 corresponds to the first side 35 of the apparatus 2.

In this configuration, the detection part 310 and the display part 320 are parallel. The first side 311 of the detection part 310 forms an exterior face of the electronic apparatus 300. A first side 321 of the display part 320 forms another exterior face of the electronic apparatus 300. The second side 312 of the detection part 310 and the second side 322 of the display part 320 make contact 302 as interior opposing faces of the electronic apparatus 300.

The first side 311 of the detection part 310 enables touch detection. The second side 322 of the display part 320 provides the display 212.

The configurable electronic apparatus 300 has a second configuration illustrated in FIG. 10B. The apparatus 2 operates as an input panel that is separated from the display 212. In this configuration, the electronic apparatus 300 is similar to a laptop with the input panel providing a keyboard. The second side 312 of the detection part 310 is used for detection. The second side 312 of the detection part 310 corresponds to the second side 36 of the apparatus 2.

In this configuration, the detection part 310 and the display part 320 are not parallel. The first side 311 of the detection part 310 forms a base of the electronic apparatus 300. A first side 321 of the display part 320 forms another exterior face of a movable lid for the electronic apparatus 300. The second side 312 of the detection part 310 forms a keyboard and the second side 322 of the display part 320 provides a display 212.

The second side 312 of the detection part 310 enables touch detection. The second side 322 of the display part 320 provides the display 212.

When the electronic device 300 is in the first configuration, the apparatus 2 may be in the first mode.

When the electronic device 300 is in the second configuration, the apparatus 2 may be in the second mode.

A detector may be provided, for example as part of the hinge 306 that detects a change in configuration of the electronic device 300 and causes a change in the mode of the apparatus 2.

The detection part 310 of the electronic apparatus 300 is reversible. It is reversed by changing the configuration of the electronic apparatus 300.

Figure 11A:
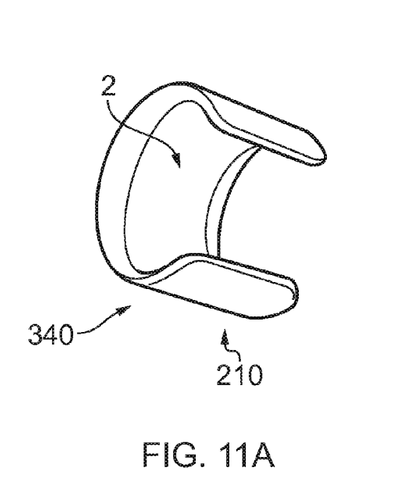
FIGS. 11A and 11B illustrate a reversible electronic apparatus.
Figure 11B:
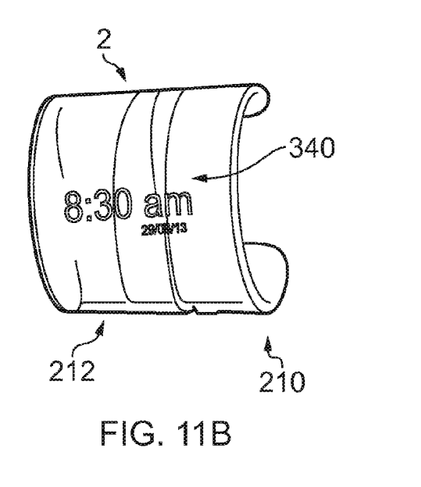

FIGS. 11A and 11B illustrate another example of a reversible electronic apparatus 340. The electronic apparatus 340 is a curved touch sensitive display module 210 that comprises the apparatus 2 and a display 212.

It this example, the curved touch sensitive display module 210 may be flexible (bendable) or rigid.

Figure 12:
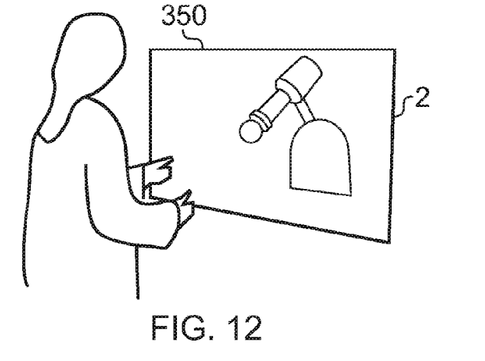
FIG. 12 illustrates a dual-sided touch sensitive wall portion.

FIG. 12 illustrates another example of the apparatus 2. A portion 350 is combined with the apparatus 2 so that the portion has touch sensitivity on both sides.

In this example, the portion is a transparent wall portion. In other examples, the portion may be opaque and used to enter another region. For example, it may be a lid to a box or a door. The apparatus 2 provides information about what might be behind the opaque portion when a user touches or approaches it. Where the apparatus 2 is part of a door, the apparatus 2 may issue a warning or control how fast the door can open, when it detects potential users of the door on both sides of the door.

It should be appreciated that FIGS. 5A, 5B and 5C illustrate a method comprising: at a first time (FIG. 5B), maintaining one or more first shield electrode portions 21, positioned on a first side of a sensing arrangement 5 in overlap with conductive traces 10 of the sensing arrangement 5, and one or more second shield electrode portions 22, positioned on the first side of the sensing arrangement in overlap with capacitive sensor electrodes 6 of the sensing arrangement 5, at a common electric potential; and at a second time different time to the first time (FIG. 5A, 5C), maintaining one or more first shield electrode portions 21, positioned on the first side of the sensing arrangement in overlap with conductive traces 10 of the sensing arrangement, but not one or more second shield electrode portions 22, positioned on the first side of the sensing arrangement 5 in overlap with capacitive sensor electrodes 6 of the sensing arrangement, at a common electric potential.

It should be appreciated that FIGS. 5A, 5B and 5C additionally illustrate, at the first time (FIG. 5B), maintaining one or more third shield electrode portions 23, positioned on a second side of the sensing arrangement 5 in overlap with conductive traces 10 of the sensing arrangement 5 (but not the fourth shield electrode portions 24) at the common electric potential.

It should be appreciated that FIGS. 5A, 5B and 5C additionally illustrate, at the second time different time to the first time (FIG. 5A), maintaining one or more third shield electrode portions 23, positioned on the second side of the sensing arrangement in overlap with conductive traces 10 of the sensing arrangement 5 and one or more fourth shield electrode portions 24, positioned on the first side of the sensing arrangement 5 in overlap with capacitive sensor electrodes 6 of the sensing arrangement, at the common electric potential.

It should be appreciated that FIGS. 5A, 5B and 5C additionally illustrate, at the second time different time to the first time (FIG. 5C), maintaining one or more third shield electrode portions 23, positioned on the second side of the sensing arrangement in overlap with conductive traces 10 of the sensing arrangement 5 (but not the fourth shield electrode portions 24) at the common electric potential.

As used here 'module' refers to a unit or apparatus that excludes certain parts/components that would be added by an end manufacturer or a user.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term 'example' or 'for example' or 'may' in the text denotes, whether explicitly stated or not, that such features or functions are present in at least the described example, whether described as an example or not, and that they can be, but are not necessarily, present in some of or all other examples. Thus 'example', 'for example' or 'may' refers to a particular instance in a class of examples. A property of the instance can be a property of only that instance or a property of the class or a property of a sub-class of the class that includes some but not all of the instances in the class.

As used in this application, the term 'circuitry' refers to all of the following:
(a) hardware-only circuit implementations (such as implementations in only analog and/or digital circuitry) and
(b) to combinations of circuits and software (and/or firmware), such as (as applicable):
(i) to a combination of processor(s) or (ii) to portions of processor(s)/software (including digital signal processor(s)), software, and memory(ies) that work together to cause an apparatus, such as a mobile phone or server, to perform various functions) and
(c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in a server, a cellular network device, or other network device.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

I claim:

1. An apparatus comprising:
    a plurality of distinct capacitive sensor electrodes distributed over a sensing area; conductive traces connected to respective ones of the plurality of distinct capacitive sensor electrodes;
    one or more first shield electrode portions, positioned on a first side of the sensing area to overlap, in the sensing area, at least some of the conductive traces, and one or more second shield electrode portions, positioned on the first side of the sensing area to overlap, in the sensing area, at least some of the capacitive sensor electrodes, wherein at least some of the one or more second shield electrode portions overlap, in the sensing area, the capacitive sensor electrodes but not the conductive traces; and
    circuitry configured to switch the apparatus between a first mode in which the one or more first shield electrode portions are operated as a single electrode independently of the one or more second shield electrode portions and a second mode in which the one or more first shield electrode portions and the one or more second shield electrode portions are operated as a single electrode.

2. An apparatus as claimed in claim 1, wherein all of the one or more second shield electrode portions overlap, in the sensing area, the capacitive sensor electrodes but not the conductive traces.

3. An apparatus as claimed in claim 1, the one or more second shield electrode portions are substantially aligned with the capacitive sensor electrodes.

4. An apparatus as claimed in claim 1, wherein, in combination, the one or more first shield electrode portions and the one or more second shield electrode portions overlap substantially all of the sensing area.

5. An apparatus as claimed in claim 1, wherein the one or more first shield electrode portions and the one or more second shield electrode portions occupy a common layer.

6. An apparatus as claimed in claim 1, wherein the one or more first shield electrode portions and the one or more second shield electrode portions are formed from the same conductive and transparent material.

7. An apparatus as claimed in claim 1, comprising circuitry configured to apply, when the apparatus is in a first mode, a first voltage to the one or more first shield electrode portions but not to the one or more second shield electrode portions and configured to apply, when the apparatus is in a second mode, a second voltage to the one or more first shield electrode portions and the one or more second shield electrode portions.

8. An apparatus as claimed in claim 7, comprising circuitry configured to electrically isolate the one or more second shield electrode portions when the apparatus is in the first mode.

9. An apparatus as claimed in claim 1, further comprising:
one or more third shield electrode portions, positioned on a second side of the plurality of capacitive sensor electrodes to overlap, in the sensing area, conductive traces, and one or more fourth shield electrode portions, positioned on the second side of the plurality of capacitive sensor electrodes to overlap, in the sensing area, capacitive sensor electrodes.

10. An apparatus as claimed in claim 9, wherein the one or more fourth electrode portions overlap, in the sensing area, the capacitive sensor electrodes but not the conductive traces.

11. An apparatus as claimed in claim 9, wherein the one or more third shield electrode portions and the one or more fourth shield electrode portions occupy a common layer.

12. An apparatus as claimed in claim 9, comprising circuitry configured to switch the apparatus to a first mode in which the one or more third shield electrode portions, the one or more fourth shield electrode portions and the one or more first shield electrode portions and are operated as a common electrode distinct from the one or more second shield electrode portions.

13. An apparatus as claimed in claim 9, comprising circuitry configured to switch the apparatus to a second mode in which the one or more first shield electrode portions, the one or more second shield electrode portions and the one or more third shield electrode portions and are operated as a common electrode distinct from the one or more fourth shield electrode portions.

14. An apparatus as claimed in claim 9, comprising circuitry configured to electrically isolate the one or more fourth shield electrode portions, when the apparatus is in a second mode.

15. An apparatus as claimed in claim 9, comprising circuitry configured to switch the apparatus to a third mode in which the one or more first shield electrode portions, and the one or more third shield electrode portions and are operated as a common electrode distinct from the one or more fourth shield electrode portions and from the one or more second shield electrode portions.

16. An apparatus as claimed in claim 9, comprising circuitry is configured to electrically isolate the one or more second shield electrode portions and to electrically isolate the one or more fourth shield electrode portions, when the apparatus is in a third mode.

17. An apparatus as claimed in claim 1 embodied as a touch panel module.

18. A method comprising:
at a first time, maintaining one or more first shield electrode portions, positioned on a first side of a sensing arrangement in overlap with conductive traces of the sensing arrangement, and one or more second shield electrode portions, positioned on the first side of the sensing arrangement in overlap with capacitive sensor electrodes of the sensing arrangement, at a common electric potential; and at a second time different from the first time, maintaining one or more first shield electrode portions, positioned on the first side of the sensing arrangement in overlap with conductive traces of the sensing arrangement, but not one or more second shield electrode portions, positioned on the first side of the sensing arrangement in overlap with capacitive sensor electrodes of the sensing arrangement, at a common electric potential.

19. A computer program stored on a non-transitory storage medium, which when loaded into a processor, enables:
at a first time, maintaining one or more first shield electrode portions, positioned on a first side of a sensing arrangement in overlap with conductive traces of the sensing arrangement, and one or more second shield electrode portions, positioned on the first side of the sensing arrangement in overlap with capacitive sensor electrodes of the sensing arrangement, at a common electric potential; and at a second time different from the first time, maintaining one or more first shield electrode portions, positioned on the first side of the sensing arrangement in overlap with conductive traces of the sensing arrangement, but not one or more second shield electrode portions, positioned on the first side of the sensing arrangement in overlap with capacitive sensor electrodes of the sensing arrangement, at a common electric potential.

* * * * *